United States Patent
Watahiki

(10) Patent No.: US 8,410,743 B2
(45) Date of Patent: Apr. 2, 2013

(54) PULSE GENERATING DEVICE, ROTATOR MODULE, ROTATIONAL SPEED CONTROL DEVICE, AND IMAGE FORMING APPARATUS

(75) Inventor: Tatsuya Watahiki, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 282 days.

(21) Appl. No.: 12/876,752

(22) Filed: Sep. 7, 2010

(65) Prior Publication Data

US 2011/0057822 A1    Mar. 10, 2011

(30) Foreign Application Priority Data

Sep. 9, 2009 (JP) .................................. 2009-208465

(51) Int. Cl.
    *H02P 1/26* (2006.01)
(52) U.S. Cl. ......... 318/779; 318/633; 318/640; 318/652
(58) Field of Classification Search .................. 318/779, 318/633, 640, 652

See application file for complete search history.

(56) References Cited

U.S. PATENT DOCUMENTS

| | | | | |
|---|---|---|---|---|
| 5,900,709 A | * | 5/1999 | Kanda et al. | 318/652 |
| 6,331,759 B1 | * | 12/2001 | Atmur | 318/661 |
| 7,060,969 B2 | * | 6/2006 | Uchiyama et al. | 250/231.16 |
| 2005/0168187 A1 | | 8/2005 | Uchiyama et al. | |

FOREIGN PATENT DOCUMENTS

| | | |
|---|---|---|
| JP | 2005-168280 | 6/2005 |
| JP | 2006-90759 | 4/2006 |
| JP | 2007-78538 | 3/2007 |
| JP | 2007-183255 | 7/2007 |
| JP | 2008-44767 | 2/2008 |
| JP | 2009-71998 | 4/2009 |

\* cited by examiner

*Primary Examiner* — Walter Benson
*Assistant Examiner* — David Luo
(74) *Attorney, Agent, or Firm* — Oblon, Spivak, McClelland, Maier & Neustadt, L.L.P.

(57) ABSTRACT

A pulse generating device includes a rotatable disc having a plurality of patterns that are formed on a surface of the rotatable disc in a circumferential direction of the rotatable disc, and three pulse generators to each detect the plurality of patterns formed on the rotatable disc and to respectively generate three pulse signals each corresponding to a rotational speed of the rotatable disc based on the detected patterns. The three pulse generators are evenly spaced at intervals of 120 degrees of angle with respect to a rotational axis of the rotatable disc in the circumferential direction of the rotatable disc.

6 Claims, 14 Drawing Sheets

PULSE GENERATING DEVICE, ROTATOR MODULE, ROTATIONAL SPEED CONTROL DEVICE, AND IMAGE FORMING APPARATUS

CROSS-REFERENCE TO RELATED APPLICATIONS

This patent application is based on and claims priority under 35 U.S.C. §119 to Japanese Patent Application No. 2009-208465, filed on Sep. 9, 2009, in the Japanese Patent Office, the entire disclosure of which is hereby incorporated herein by reference.

FIELD OF THE INVENTION

The present invention generally relates to a pulse generating device that is used to detect rotational speed of a rotator, a rotator module having the pulse generating device and the rotator, a rotational speed control device having the pulse generating device, and an image forming apparatus having the rotational speed control device.

BACKGROUND

An image forming apparatus such as a color printer has a number of motors for driving various parts of the image forming apparatus such as a drum motor that drives a photoconductive drum. In order to produce high quality image, fluctuations in rotational speed of the motor need to be suppressed.

To suppress fluctuations in rotational speed of a motor such as the drum motor, a rotary encoder having an encoder sensor is fixed to a rotational shaft of the drum motor, or a rotational shaft of the photoconductive drum that rotates together with rotation of the drum motor. Based on an output signal of the encoder sensor, the rotational speed of the photoconductive drum or the drum motor is controlled.

In order to eliminate an error component of the output signal of the encoder sensor, which may be introduced by eccentricity of the encoder, two encoder sensors may be provided at predetermined positions of the encoder. By averaging output signals of the two encoder sensors, the error component attributable to eccentricity of the encoder can be eliminated. This technique of eliminating the error component using two encoder sensors, however, is not capable of eliminating an error component introduced when the encoder is deformed to be elliptical in shape.

In order to eliminate an error component attributable to elliptical deformation of the encoder, Japanese Patent Application Publication No. 2005-168280A discloses a rotary encoder having three encoders as illustrated in FIGS. 15A and 15B. FIG. 15A is a plan view of the rotary encoder, and FIG. 15B is a front view of the rotary encoder.

Referring to FIGS. 15A and 15B, the rotary encoder is implemented by a code wheel 110 that rotates around a rotational axis 160. Slits 110x are formed on a surface of the code wheel 110 in a circumferential direction of the code wheel 110. As illustrated in FIG. 15A, the code wheel 110 is provided with encoder sensors 320a, 320b, and 320c, which are arranged at 90-degree intervals in the circumferential direction of the code wheel 110.

A rotation measurement signal from which the error component attributable to eccentricity and the error component attributable to deformation are removed is obtained based on the output signals of the encoder sensors 320a, 320b, and 320c that are detected, and estimated values of the encoder sensors 320a and 320c that are estimated to be output as the phase is advanced by a certain degree with respect to the phase of the detected output signals are calculated using output signals of the encoder sensors 320a and 320c that were previously detected for a phase prior to the advanced phase.

However, this technique of removing the error component disclosed in Japanese Patent Application Publication No. 2005-168280A may not completely remove the error component superimposed on the output signals of the encoder sensors, because the estimated values of the encoder sensors that are necessary for error component elimination are calculated based on the output signals for the previous phase. Accordingly, fluctuations in rotational speed of the rotator may not be accurately detected.

SUMMARY

In view of the above, there is a need for a technique of completely eliminating an error component such as an error component attributable to eccentricity of the encoder and an error component attributable to deformation of the encoder from encoder signals. Based on an encoder signal from which the error component is completely removed, fluctuations in rotational speed of a rotator can be obtained with higher accuracy, resulting in more precise control of the rotational speed of the rotator.

Example embodiments of the present invention include a pulse generating device including: a rotatable disc having a plurality of patterns that are formed on a surface of the rotatable disc in a circumferential direction of the rotatable disc; and three pulse generators to each detect the plurality of patterns formed on the rotatable disc and to respectively generate three pulse signals each corresponding to a rotational speed of the rotatable disc based on the detected patterns, wherein the three pulse generators are evenly spaced at intervals of 120 degrees of angel with respect to a rotational axis of the rotatable disc in the circumferential direction of the rotatable disc.

Example embodiments of the present invention include a rotator module having a rotator that rotates in synchronization with the rotatable disc and the above-described pulse generating device.

Example embodiments of the present invention include: a rotational speed control device for controlling a rotational speed of a rotator. The rotational speed control device includes: a rotatable disc having a plurality of patterns that are formed on a surface of the rotatable disc in a circumferential direction of the rotatable disc, the rotatable disc rotating in synchronization with the rotator; three pulse generators to each detect the plurality of patterns formed on the rotatable disc and to respectively generate three pulse signals each corresponding to a rotational speed of the rotatable disc based on the detected patterns, wherein the three pulse generators are evenly spaced at intervals of 120 degrees of angle with respect to a rotational axis of the rotatable disc in the circumferential direction of the rotatable disc; and a controller to control the rotational speed of the rotator based on a signal from which an error component superimposed on the three pulse signals respectively generated by the three pulse generators is removed.

Example embodiments of the present invention include an image forming apparatus provided with the above-described rotational control device.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
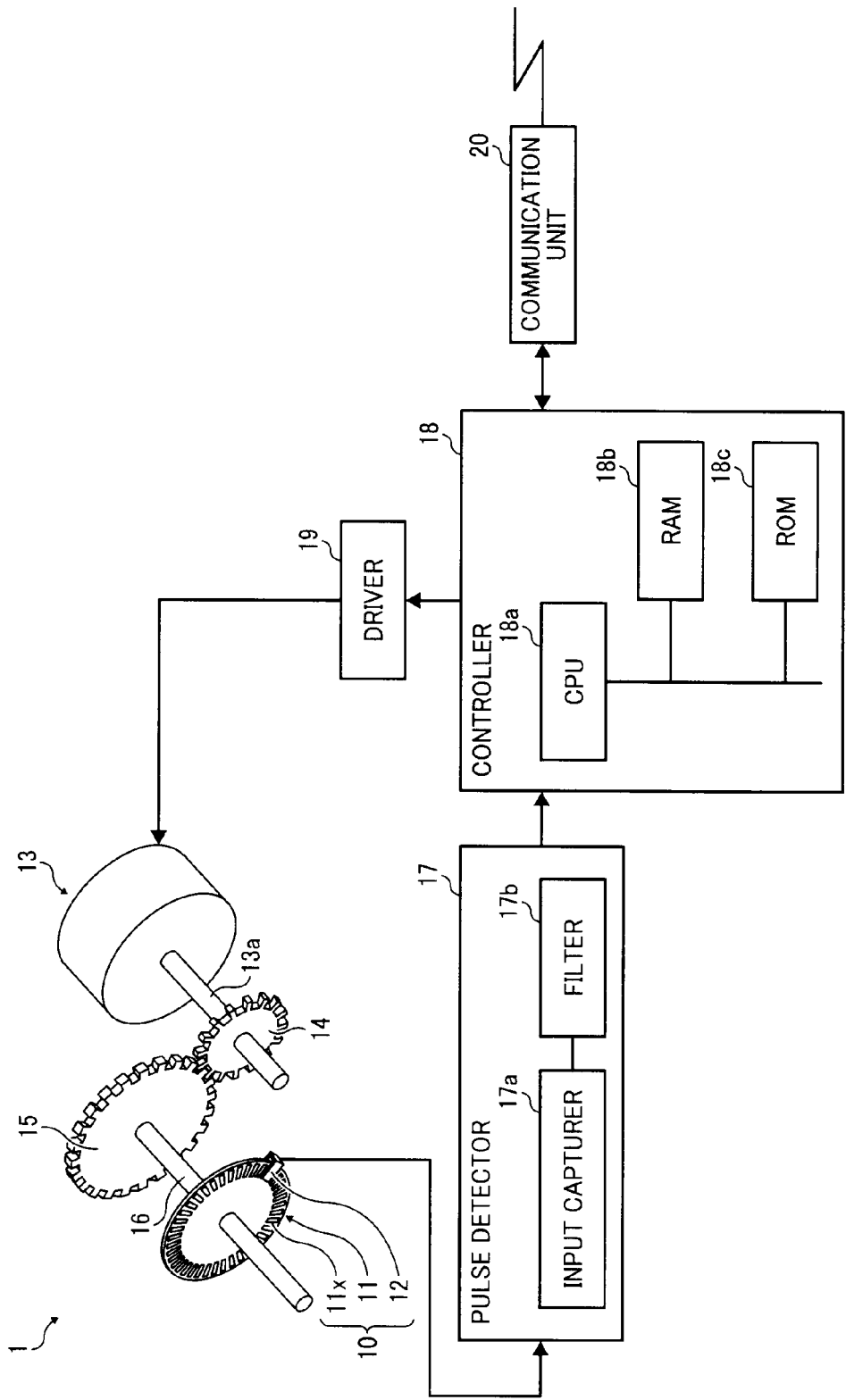
FIG. 1 is a schematic block diagram illustrating a structure of a rotational speed control device having an encoder.

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that operate in a similar manner.

Referring to FIG. 1, a rotational speed control device 1 having an encoder is explained. The rotational speed control device 1 of FIG. 1 includes an encoder 10, a motor 13 having a rotational shaft 13a, a gear 14, a gear 15, a rotational shaft 16, a pulse detector 17, a controller 18, a driver 19, and a communication unit 20. The encoder 10 includes a code wheel 11 having a plurality of slits 11x, and a pulse generator 12.

Figure 2:
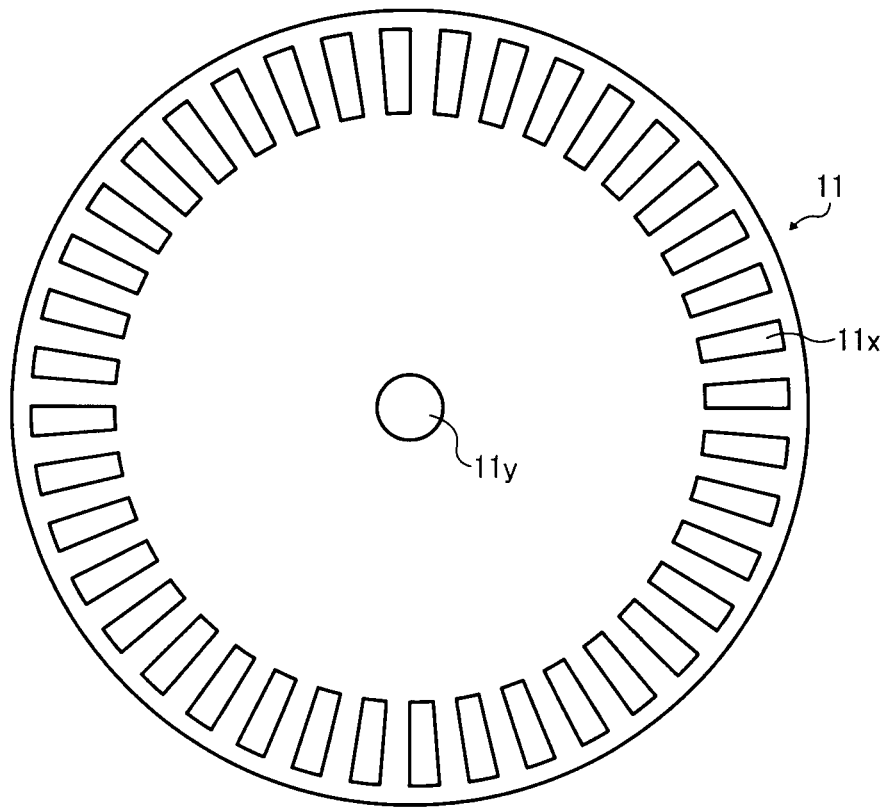
FIG. 2 is an illustration of a code wheel incorporated in the encoder of FIG. 1.

The motor 13 is a rotator that rotates with rotation of the rotational shaft 13a according to an applied voltage. The gear 14 is fixed to the rotational shaft 13a such that the gear 14 rotates with the rotational shaft 13 around the same rotational axis. The gear 15 and the code wheel 11 of the encoder 10 are respectively fixed to the rotational shaft 16 such that the gear 15 and the code wheel 11 rotate with the rotational shaft 16 around the same rotational axis. The gear 15 is geared with the gear 14. The gear 14, the gear 15, and the code wheel 11 each have a disc-shape. As illustrated in FIG. 2, the code wheel 11 is a rotatable object formed of material that shields light irradiated from the pulse generator 12. On an outer peripheral edge portion of the code wheel 11, the slits 11x are formed along the circumferential direction in substantially the same distance from each other. Since the light irradiated by the pulse generator 12 is transmitted through the slits 11x, the slits 11x each function as a rotational speed detection pattern, which is used for detecting a rotational speed of the code wheel 11. The code wheel 11 is provided with a through hole 11y through which the rotational shaft 16 is inserted, at the center portion of the code wheel 11.

The pulse generator 12 is an optical sensor having a U-shaped cross section. The pulse generator 12 is provided at a position not in contact with the code wheel 11, but adjacent to the code wheel 11 such that the slits 11x are placed between edge portions of the U-shaped pulse generator 12 that face with each other. The pulse generator 12 is provided with a light irradiating element and a light receiving element. The light irradiating element is placed at one of the edge portions of the pulse generator 12 that together cover the slits 11x, while the light receiving element is placed at the other one of the edge portions of the pulse generator 12. The pulse generator 12 may be implemented by a transmissive type photo-interrupter.

When the rotational shaft 13a of the motor 13 rotates at a predetermined rotational speed, the code wheel 11 rotates in synchronization with rotation of the motor 13 at a rotational speed that is slower than the rotational speed of the motor 13. More specifically, the rotational speed of the code wheel 11 is determined based on the rotational speed of the motor 13 that is reduced by the gear ratio between the gear 14 and the gear 15. When the light irradiated by the light irradiating element of the pulse generator 12 enters through the slits 11, the light receiving element detects the light. When the light irradiated by the light irradiating element of the pulse generator 12 is shielded by a portion of the code wheel between the slits 11x, the light receiving element does not detect the light. Accordingly, the light receiving element of the pulse generator 12 generates a pulse signal, which is an on or off signal, depending on whether the light receiving element receives a light through the slits 11x or not according to rotation of the code wheel 11. Thus, the pulse signal generated by the light receiving element of the pulse generator 12 corresponds to the rotational speed of the code wheel 11.

As described above, the pulse generator 12 detects the slits 11x functioning as the rotational speed detection patterns, and generates a pulse signal that reflects the rotational speed of the code wheel 11, which is based on the rotational speed of the motor 13. The rotational speed of the code wheel 11 can be detected based on a number of pulse signals that is generated by the pulse generator 12 per unit time, or the pulse width of the pulse signals.

The pulse signal generated by the pulse generator 12 is input to the pulse detector 17. The pulse detector 17 includes an input capturer 17a and a filter 17b. The input capturer 17a counts a stand-up edge interval of the input pulse signal to obtain a pulse interval time, or a pulse cycle, of the input pulse signal in the form of data such as 4-bit data. The pulse interval time data or the pulse cycle data obtained by the input capturer 17a may be referred to as pulse interval data. The process of obtaining the pulse interval data performed by the input capturer 17a may be referred to as the input capture process.

The pulse interval data is input to the filter 17b. The filter 17b may be implemented by a digital filter, and has a function of applying filtering process such as noise removal or averaging. In one example, when the pulse interval data has a value that is unexpectedly large or small, the filter 17b removes the pulse interval data having the unexpected value. In another example, the filter 17b may average the pulse interval data in order to remove high frequency noise attributable to an environmental factor, for example, by obtaining the average of a plurality of values that are sequentially obtained as the pulse interval data. The input capturer 17 and the filter 17b may each be implemented as software or hardware, or a combination of software and hardware.

In this example, the input capturer 17a obtains the pulse interval data or the pulse cycle data. Alternatively, the pulse interval data may be obtained in various other ways, for example, using software that monitors the change in pulse signal and calculates its cycle. The functions of the filter 17b are not limited to the above-described example of noise removal and averaging such that any desired filter processing may be applied depending on capability or objective of the system. Further, the filter detector 17 does not have to be provided with the filter 17b.

The pulse interval data, which is processed by the pulse detector 17, is input to the controller 18. The controller 18 feed-back controls rotation of the motor 13 using the pulse interval data input by the pulse detector 17. The controller 18 includes a central processing unit (CPU) 18a, a random access memory (RAM) 18b, and a read only memory (ROM) 18c. The CPU 18a controls entire operation of the rotational speed control device 1 through the controller 18. The RAM 18b, which is implemented by a volatile memory, stores data needed for control of the rotational speed control device 1 at least temporarily. The ROM 18c, which may be implemented by a non-volatile memory, stores various programs and data that may be used by the controller 18 to control the rotational speed control device 1. The controller 18 is not limited to a structure illustrated in FIG. 1 such that the controller 18 may be implemented in various other ways.

The driver 19 is a driver circuit which drives the motor 18 according to an instruction signal received from the controller 18. The communication unit 20 functions as an interface with the upstream system or a user, which is capable of receiving a request regarding rotation of the motor 13, for example. Based on a request received from the upstream system or the user, the communication unit 20 sends an instruction to the controller 18 regarding driving or stopping of the motor 13. The pulse generator 12, the pulse detector 17, the controller 18, the driver 19, and the communication unit 20 are connected to an electrical power supply that may be provided outside the rotational speed control device 1 to receive a predetermined supply voltage from the power supply.

Figure 3:
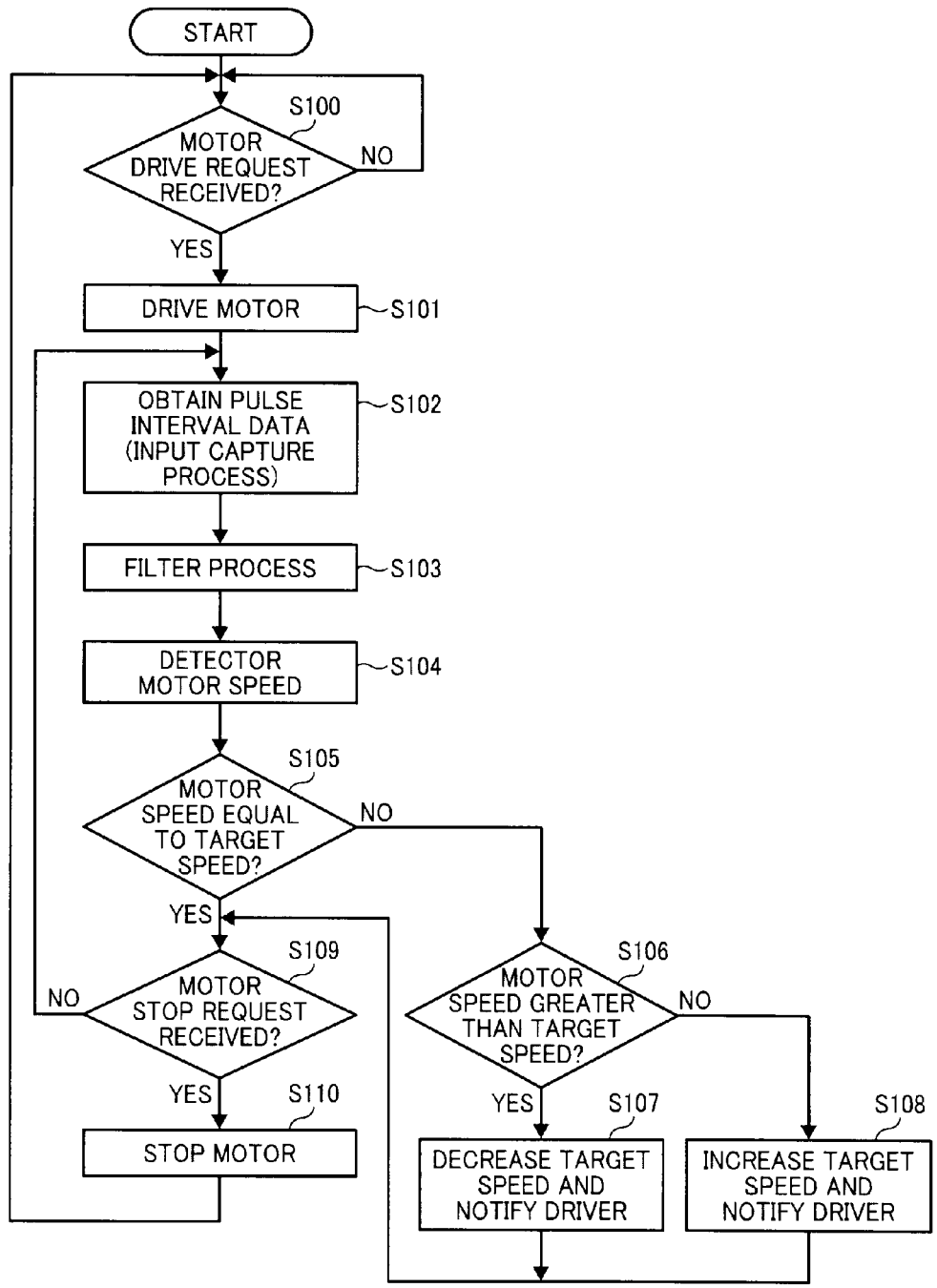
FIG. 3 is a flowchart illustrating operation of controlling the rotational speed control device of FIG. 1.

Referring now to FIG. 3, operation of controlling the rotational speed control device 1 is explained.

After power supply is applied to the rotational speed control device 1, at S100, the communication unit 20 determines whether a request for driving the motor 13 is received from the upstream system or the user. When it is determined that the request for driving the motor 13 is not received ("NO" at S100), the operation repeats S100. When it is determined that the request for driving the motor 13 is received ("YES" at S100), the operation proceeds to S101 to drive the motor 13.

More specifically, at S101, the communication unit 20 generates an instruction for driving the motor 13 to the controller 18. The controller 18 instructs the driver 19 to drive the motor 13 at a target rotational speed of the motor 13. For example, assuming that the motor 13 is a DC brushless motor, the rotational speed may be instructed using PWM duty. In such case, the controller 18 is provided with a PWM timer that arbitrarily sets a cycle and a duty. By setting the duty using software, the rotational speed of the motor 13 is set. When the motor 13 starts driving, the code wheel 11 rotates together with rotation of the motor 13. The light receiving element of the pulse generator 12 generates a pulse signal according to rotation of the code wheel 11.

At S102, after the motor 13 is executed, the input capturer 17a of the pulse generator 17 counts a pulse signal generated by the pulse generator 12 to obtain the counted pulse interval time or pulse cycle of the pulse signal as the pulse interval data.

At S103, the filter 17b of the pulse detector 17 applies filtering such as noise removal or averaging to the pulse interval data obtained by the input capturer 17a, and outputs the processed pulse interval data to the controller 18.

At S104, the controller 18 detects the rotational speed of the motor 13 based on the pulse interval data that is input.

At S105, the controller 18 compares the rotational speed of the motor 13 that is detected at S104 with the target rotational speed of the motor 13 that is previously determined.

When it is determined that the detected rotational speed of the motor 13 matches the target rotational speed of the motor 13 ("YES" at S105), the controller 18 keeps the rotational speed of the motor 13 without updating the target rotational speed that is instructed by the controller 18 based on PWM duty at S101.

When it is determined that the detected rotational speed of the motor 13 does not match the target rotational speed of the motor 13 ("NO" at S105), the operation proceeds to S106. At S106, the controller 18 determines whether the detected rotational speed of the motor 13 detected at S104 is greater than the target rotational speed of the motor 13 that is previously determined.

When it is determined that the detected rotational speed of the motor 13 is greater than the target rotational speed of the motor 13 ("YES" at S106), the operation proceeds to S107. At S107, the controller 18 updates the PWM timer value to lower the PWM duty, thus reducing the target rotational speed of the motor 13. The updated target rotational speed of the motor 13 is notified to the driver 19. With the updated target rotational speed of the motor 13, the motor 13 rotates at a slower rotational speed to generate a pulse interval time having a longer time period.

When it is determined that the rotational speed of the motor 13 is less than the target rotational speed of the motor 13 ("NO" at S106), the operation proceed to S108. At S108, the controller 18 updates the PWM timer value to increase the PWM duty, thus increasing the target rotational speed of the motor 13. The updated target rotational speed of the motor 13 is notified to the driver 19. With the updated target rotational speed of the motor 13, the motor 13 rotates at a faster rotational speed to generate a pulse interval time having a shorter time period.

At S109, the communication unit 20 determines whether a request for stopping the motor 13 is received from the upstream system or the user. When it is determined that the request for stopping the motor 13 is received ("YES" at S109), the operation proceeds to S110. At S110, the communication unit 20 sends an instruction for stopping the motor 13 to the controller 18. The controller 18 notifies the driver 19 to stop driving the motor 13 with a target rotational speed of zero. Accordingly, the motor 13 stops driving. When it is determined that the request for stopping the motor 13 is not received ("NO" at S109), the operation returns to S102 to repeat S102 to S109.

As described above referring to FIG. 3, the motor 13 is driven at the target rotational speed. In the above-described example, the rotational speed of the motor 13 is controlled through changing the PWM duty of the PWM timer of the controller 18. Alternatively, the rotational speed of the motor 13 may be controlled in various other ways.

The above-described operation of feed-back controlling the rotational speed of the motor 13 is performed based on assumption that the rotational speed of the motor 13 is detected with high accuracy. More specifically, the rotational speed control device 1 needs to be provided with an encoder capable of detecting the rotational speed of the motor 13, while eliminating an error component such as an error component attributable to eccentricity of the code wheel 11 and an error component attributable to deformation of the code wheel 11 from the signals detected by the pulse generator 12.

Figure 4:
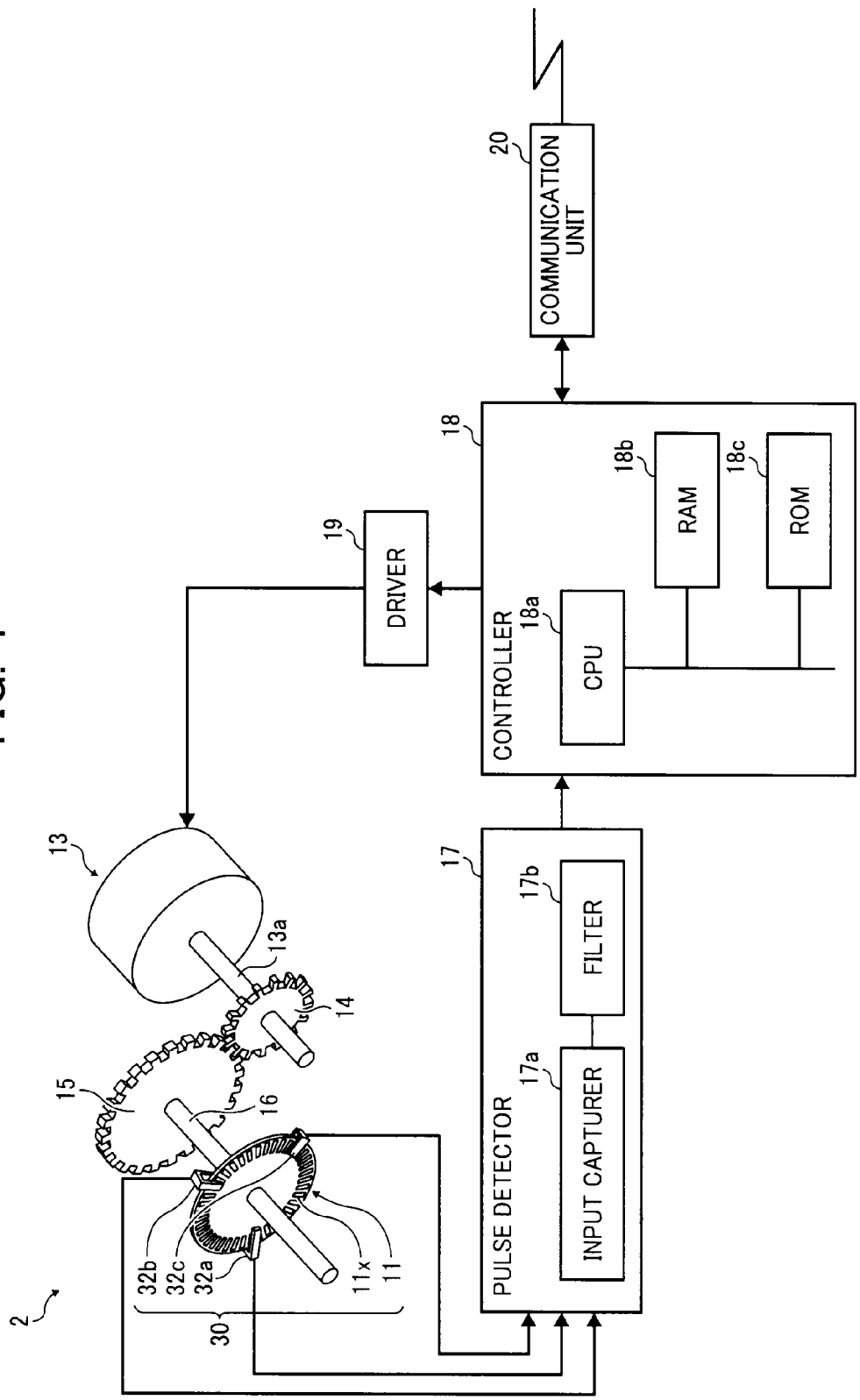
FIG. 4 is a schematic block diagram illustrating a structure of a rotational speed control device having an encoder according to an example embodiment of the present invention.
Figure 5A:
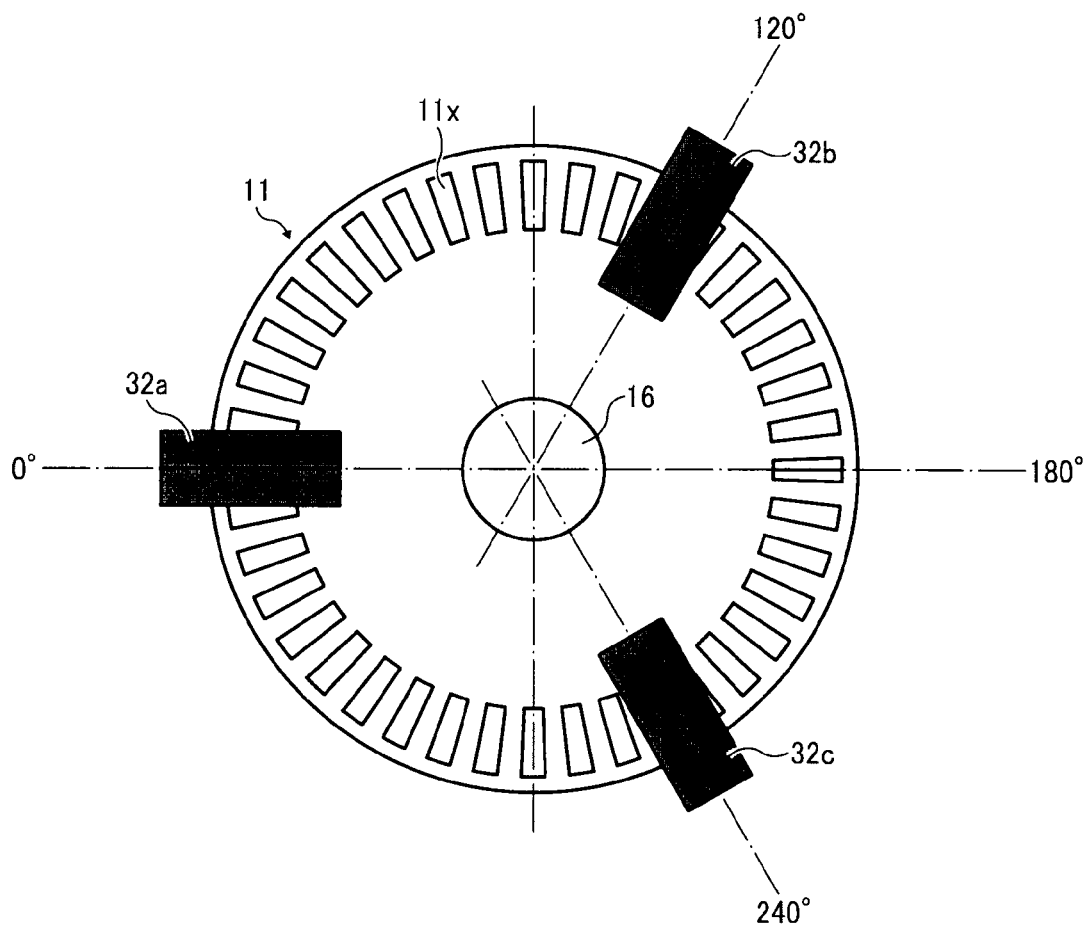
FIG. 5 is an illustration of the encoder of the rotational speed control device of FIG. 4.
Figure 5B:
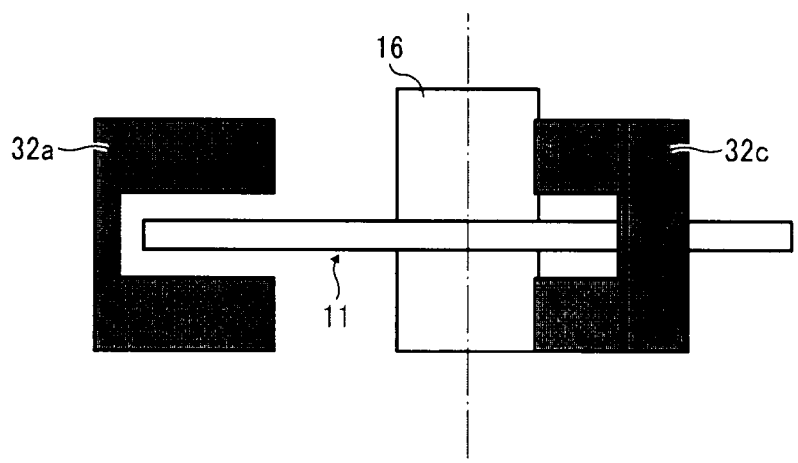

Referring to FIG. 4, a structure of a rotational speed control device 2 having an encoder 30 is explained, according to an example embodiment of the present invention. The rotational speed control device 2 is substantially similar in structure to the rotational speed control device 1 of FIG. 1. The differences include replacement of the encoder 10 by the encoder 30. FIG. 5A illustrates a plan view of the encoder 30 of FIG. 4, and FIG. 5B illustrates a front view of the encoder 30 of FIG. 4. In FIGS. 5A and 5B, the encoder 30 is fixed to the rotational shaft 16.

Referring to FIGS. 4, 5A, and 5B, the encoder 30 includes a code wheel 11, and three pulse generators 32a, 32b, and 32c. Further, in this example, it is assumed that the pulse generators 32a, 32b, and 32c each have the same structure and function. The code wheel 11 of the encoder 30 is fixed to the rotational shaft 16 such that the encoder 30 rotates with the rotational shaft 16 around the same rotational axis. The encoder 30 may be implemented in various structures other than the structure illustrated in FIGS. 5A and 5B.

The code wheel 11 is a rotatable body formed of material that shields light irradiated by the pulse generators 32a to 32c. On an outer peripheral edge portion of the code wheel 11, the slits 11x are formed along the circumferential direction in substantially the same distance from each other. Since the light irradiated by each one of the pulse generators 32a to 32c is transmitted through he slits 11x, the slits 11x each function as a rotational speed detection pattern, which is used for detecting the rotational speed of the code wheel 11, or the rotational speed of the motor 13.

The pulse generators 32a to 32c, which may be collectively referred to as the pulse generator 32, are each implemented by an optical sensor having a U-shaped cross section. The pulse generator 32 is provided at a position not in contact with the code wheel 11, but adjacent to the code wheel 11 such that the slits 11x of the code wheel 11 are placed between edge portions of the U-shaped pulse generator 32 that face with each other. The pulse generator 32 is arranged at a position such that an opening section of the U-shaped pulse generator 32 faces toward the center of the rotational shaft 16. Further, the pulse generators 32a, 32b, and 32c are arranged so as to be equally spaced at intervals of 120 degrees of angle from each other. The pulse generator 32 is provided with a light irradiating element and a light receiving element. The light irradiating element is placed at one of the edge portions of the pulse generator 32 that together cover the slits 11x, while the light receiving element is placed at the other one of the edge portions of the pulse generator 32. The pulse generator 32 may be implemented by a transmissive type photo-interrupter.

When the rotational shaft 13a of the motor 13 rotates at a predetermined rotational speed, the code wheel 11 rotates in synchronization with rotation of the motor 13 at a rotational speed that is slower than the rotational speed of the motor 13. More specifically, the rotational speed of the code wheel 11 is determined based on the rotational speed of the motor 13 that is reduced by the gear ratio between the gear 14 and the gear 15. When the light irradiated by the light irradiating element of the pulse generator 32 enters through the slits 11, the light receiving element detects the light. When the light irradiated by the light irradiating element of the pulse generator 32 is shielded by a portion of the code wheel between the slits 11x, the light receiving element does not detect the light. Accordingly, the light receiving element of the pulse generator 32 generates a pulse signal, which is an on or off signal, according to the rotational speed of the code wheel 11.

As described above, the pulse generator 32 detects the slits 11 functioning as the rotational speed detection patterns, and generates a pulse signal that reflects the rotational speed of the code wheel 11, which is determined based on the rotational speed of the motor 13. The rotational speed of the code wheel 11 can be detected based on a number of pulse signals that is generated by the pulse generator 32 per unit time, or the pulse width of the pulse signals. The pulse signals generated by the pulse generators 32a to 32c are input to the pulse detector 17 for further processing as described above referring to FIGS. 1 to 3.

In the above-described example, the rotational speed detection patterns may be detected in various ways other than using the slits 11x of the code wheel 11. In another example, two patterns that are different in reflectivity may be provided so as to alternately generate two types of patterns. In such case, the pulse generator 32 may be implemented by a reflective photo-interpreter or a photo-reflector.

Figure 6A:
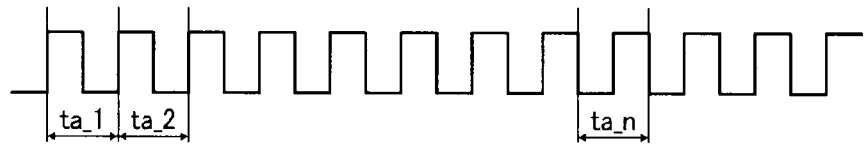
FIG. 6 are timing charts illustrating three pulse signals output from the encoder of FIG. 4, when the encoder is properly installed.
Figure 6B:
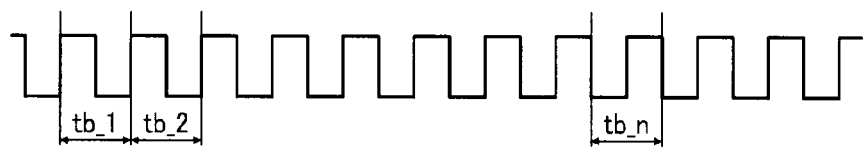
Figure 6C:
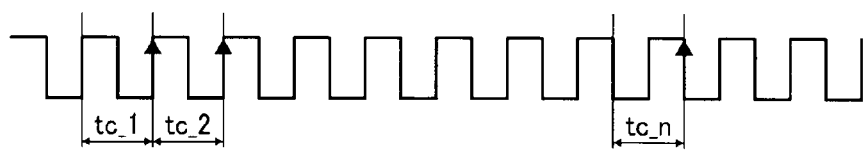

FIG. 6 illustrates pulse signals output by the encoder 30 of FIG. 4, which are generated under condition in which the code wheel 11 is properly installed to minimize position errors induced by, for example, eccentricity or deformation. FIG. 6(a) illustrates a pulse signal output by the pulse generator 32a of the encoder 30, having a pulse interval time ta_n, with n being a natural integer. FIG. 6(b) illustrates a pulse signal output by the pulse generator 32b of the encoder 30, having a pulse interval time tb_n, with n being a natural integer. FIG. 6(c) illustrates a pulse signal output by the pulse generator 32c of the encoder 30, having a pulse interval time tc_n, with n being a natural integer. The pulse signals of FIGS. 6(a), 6(b), and 6(c) are different in phase.

As illustrated in FIG. 6, the pulse signals generated by the pulse generator 32 each have a square waveform that is determined based on a distance between the slits 11x of the code wheel 11 as well as rotation of the code wheel 11 with respect to the rotational shaft 16. Since the code wheel 11 is free from eccentricity or deformation in this case, the pulse interval times ta_n, tb_n, and tb_n respectively output by the pulse generators 32a, 32b, and 32c have the same values. For this reason, the pulse detector 17 detects one of the pulse interval times ta_n, tb_n, and tb_n, and inputs the detected one of the pulse interval times ta_n, tb_n, and tb_n to the controller 18 to keep the rotational speed of the rotational shaft 16 at the same level.

Figure 7A:
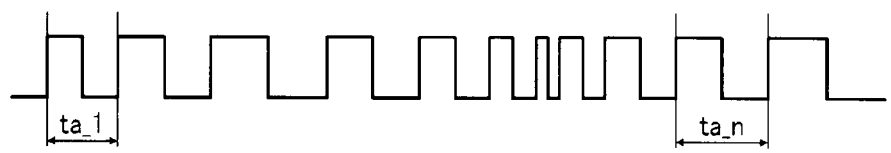
FIG. 7 are timing charts illustrating a pulse signal output by the encoder of FIG. 4 and fluctuations in rotation speed of the code wheel, when the code wheel is eccentrically installed.
Figure 7B:
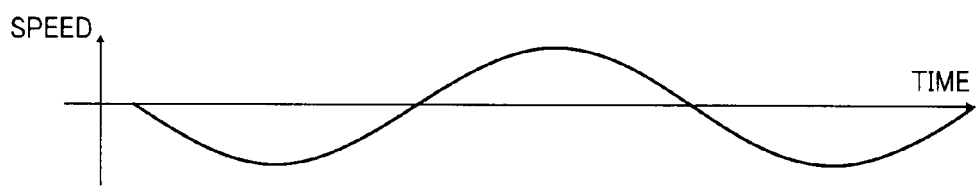

FIG. 7(a) illustrates a pulse signal output by the pulse generator 32a of the encoder 30 of FIG. 4, which is generated under condition in which the code wheel 11 is eccentrically installed with respect to the rotational shaft 16. FIG. 7(b) illustrates the fluctuations in rotational speed of the code wheel 11 obtained from the pulse signal of FIG. 7(a) that is output by the pulse generator 32a of the encoder 30. The waveform shown in FIG. 7(b) is not a signal that is actually detected by the rotational speed control device 2 of FIG. 4, but is generated so as to show information regarding the rotational speed that is obtainable from the pulse signal of FIG. 7(a).

As illustrated in FIG. 7(a), when the code wheel 11 is eccentrically installed, the pulse interval time ta_n of the pulse signal output by the pulse generator 32a fluctuates over time. More specifically, as the rotational shaft 16 rotates one cycle, an error component is generated for one-cycle. Since the pulse interval time ta_n includes this one-cycle error component, the detected pulse interval time ta_n cannot be used to control the rotational speed of the rotational shaft 16.

In order to remove this one-cycle error component in the pulse interval time ta_n, the pulse interval time ta_n is corrected using the pulse interval time tb_n output by the pulse generator 23b and the pulse interval time tc_n output by the pulse generator 23c, for example, as follows.

Figure 8A:
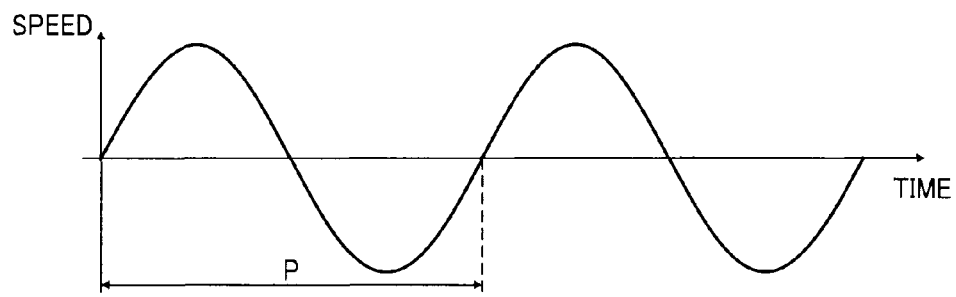
FIG. 8 are timing charts illustrating fluctuations in rotational speed of the code wheel, obtained from pulse signals output by the encoder of FIG. 4, when the code wheel is eccentrically installed.
Figure 8B:
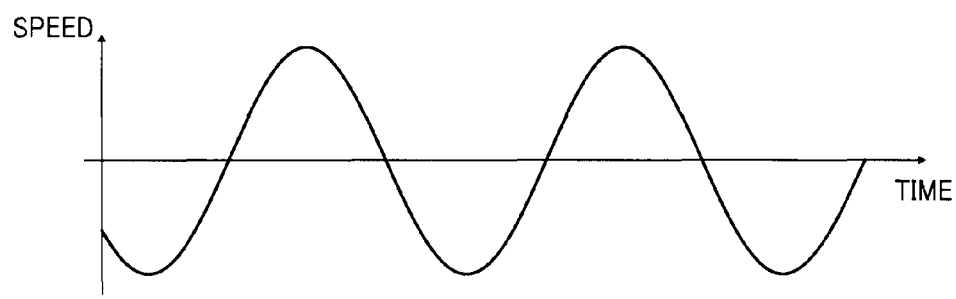
Figure 8C:
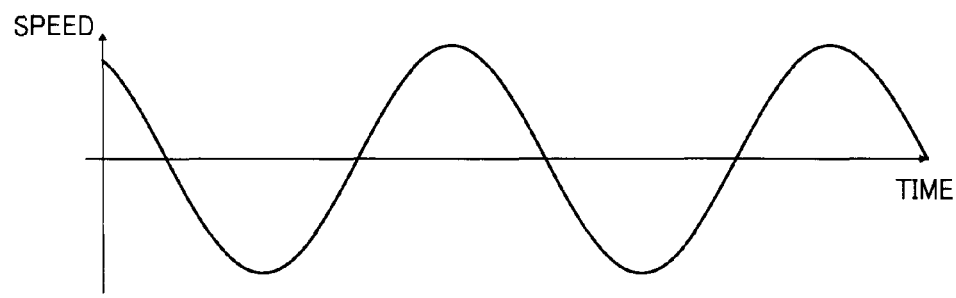

FIG. 8 illustrates the fluctuations in rotational speed of the code wheel 11 that is obtained from the pulse signals output by the encoder 30 when the code wheel is eccentrically installed. FIG. 8(a) illustrates the fluctuations in rotational speed of the code wheel 11 that is obtained from the pulse signal output by the pulse generator 32a of the encoder 30. FIG. 8(b) illustrates the fluctuations in rotational speed of the code wheel 11 that is obtained from the pulse signal output by the pulse generator 32b of the encoder 30. FIG. 8(c) illustrates the fluctuations in rotational speed of the code wheel 11 that is obtained from the pulse signal output by the pulse generator 32c of the encoder 30. The waveforms shown in FIGS. 8(a) to 8(c) are not actually detected by the rotational speed control device 2 of FIG. 4, but are generated to reflect information regarding the rotational speed that is obtainable from the pulse signals of FIG. 8(a) to FIG. 8(c).

As illustrated in FIG. 8, when the code wheel 11 is eccentrically installed, the pulse interval time ta_n output by the pulse generator 32a that is provided at the position at a relative angle of 0 degree in FIG. 5A is superimposed with the one-cycle error component, which is a one-cycle sine waveform component. Assuming that the rotational shaft 16 has an angular speed of θ, the pulse interval time of the pulse signal output by any one of the pulse generators 32a to 32c while the rotational shaft 16 rotates one cycle in the case in which the code wheel 11 is properly installed is Ts, and the pulse interval time superimposed with the one-cycle error component is T0, the detected pulse interval time Tm0 is obtained using the following equation 1. Further, in this example, the peak value, or the amplitude, is 1.

$$Tm0 = Ts + T0 = Ts + \sin\theta \qquad \text{[Equation 1]}$$

The pulse signal output by the pulse generator 32b that is provided at a relative angle of 120 degrees in FIG. 5A is superimposed with a one-cycle error component, which is a one-cycle sine waveform component. Assuming that the pulse interval time superimposed with the one-cycle error component is T120, the detected pulse interval time Tm120 is obtained using the following equation 2. In this example, the peak value, or the amplitude, is 1.

$$Tm120 = Ts + T120 = Ts + \sin(\theta + \tfrac{2}{3}\pi) \qquad \text{[Equation 2]}$$

The pulse signal output by the pulse generator 32c that is provided at a relative angle of 240 degrees in FIG. 5A is superimposed with a one-cycle error component, which is a one-cycle sine waveform component. Assuming that the pulse interval time superimposed with the one-cycle error component is T240, the detected pulse interval time Tm240 is obtained using the following equation 3. In this example, the peal value, or the amplitude, is 1.

$$Tm240 = Ts + T240 = Ts + \sin(\theta + \tfrac{4}{3}\pi) \qquad \text{[Equation 3]}$$

The average value of the pulse interval time Tm0, the pulse interval time Tm120, and the pulse interval time Tm240 is obtained using the following equation 4.

[Equation 4]

$$\begin{aligned}
(Tm0 + Tm120 + Tm240)/3 &= \{(Ts + T0) + (Ts + T120) + \\
&\quad (Ts + T240)\}/3 \\
&= [(Ts + \sin\theta) + 0\{Ts + \sin(\theta + 2/3\pi)\} + \\
&\quad \{Ts + \sin(\theta + 4/3\pi)\}]/3 \\
&= (Ts + Ts + Ts)/3 + \\
&\quad \{\sin\theta + \sin(\theta + \pi - 1/3\pi) + \\
&\quad \sin(\theta + \pi + 1/3\pi)\}/3 \\
&= Ts + \{\sin\theta - \sin(\theta - 1/3\pi) - \\
&\quad \sin(\theta + 1/3\pi)\}/3 \\
&= Ts + [\sin\theta - \{\sin\theta * \cos(1/3\pi) - \\
&\quad \cos\theta * \sin(1/3\pi)\} - \{\sin\theta * \\
&\quad \cos(1/3\pi) + \cos\theta * \sin(1/3\pi)\}]/3 \\
&= Ts + [\sin\theta - \{\sin\theta * 0.5\} - \{\sin\theta * 0.5\}]/3 \\
&= Ts + (\sin\theta - \sin\theta) \\
&= Ts
\end{aligned}$$

Referring to the above-described equation 4, with the average value of the detected pulse interval times Tm0, Tm120, and Tm240 that are respectively detected by the pulse generators 32a, 32b, and 32c arranged at 120 degree intervals, the one-cycle error component that is superimposed on the pulse interval time of the pulse signal output by the pulse generator 32 due to eccentricity of the code wheel 11 with respect to the rotational shaft 16 is eliminated. More specifically, the average value of the detected pulse interval times Tm0, Tm120, and Tm240 correctly reflects the rotational speed of the rotational shaft 16 such that the fluctuations in rotational speed can be detected with improved accuracy.

Figure 9A:
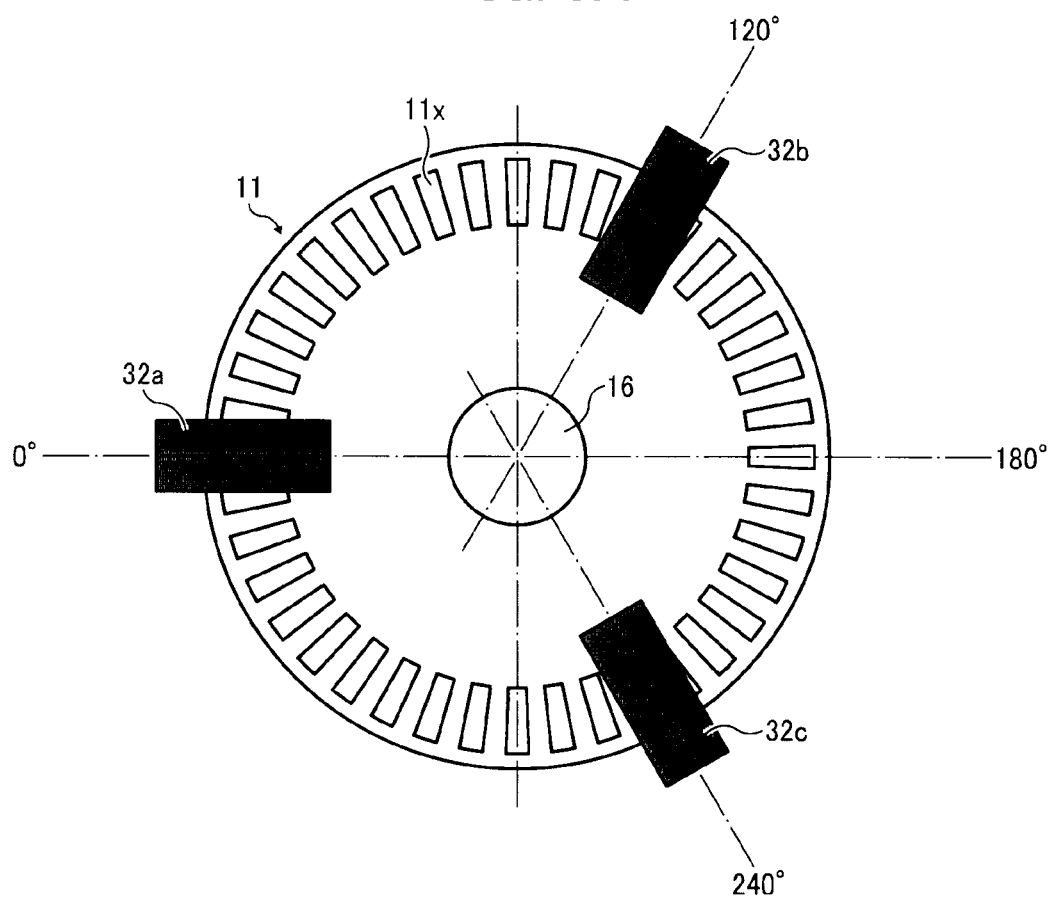
FIG. 9 is an illustration of the encoder having the code wheel that is deformed to be elliptical in shape.
Figure 9B:
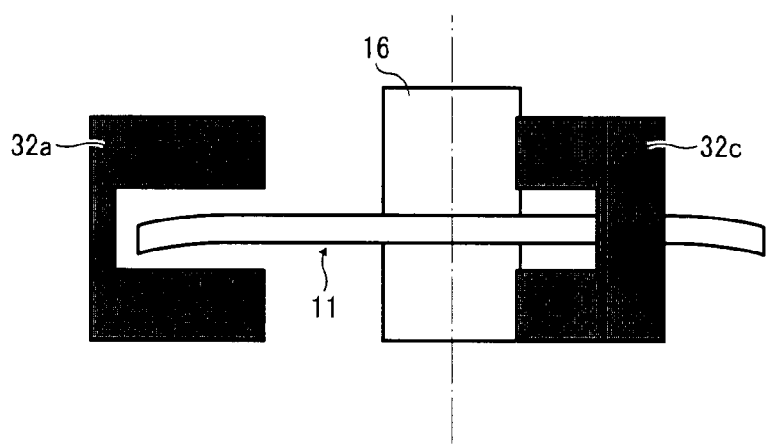

Referring now to FIGS. 9 and 10, the example case in which the code wheel 11 is deformed is explained. FIG. 9(a) is a plan view illustrating the deformed code wheel 11 having an elliptical shape. FIG. 9(b) is a front view illustrating the deformed code wheel 11 having the elliptical shape. For example, when the code wheel 11 is made of material such as polyethylene terephthalate (PET), the code wheel 11 tends to extend in the horizontal and vertical direction with different rates. This causes the code wheel 11 having a circular shape to be deformed to be elliptical in shape, for example, due to exterior heat. In another example, the code wheel 11 may warp due to excessive heat, resulting deformation of the code wheel 11 to be elliptical in shape.

When the code wheel is deformed to be elliptical in shape, the pulse interval time of the pulse signal output by the pulse generator 32 is superimposed with a two-cycle error component. The two-cycle error component is a two-cycle sine waveform component, which is superimposed on the pulse signal as the rotational shaft 16 rotates for one cycle. This two-cycle error component cannot be eliminated by averaging pulse signals output by two pulse generators that are arranged at opposing positions of the encoder.

The two-cycle error component, which may be introduced by deformation of the code wheel 11, is eliminated as follows.

Figure 10A:
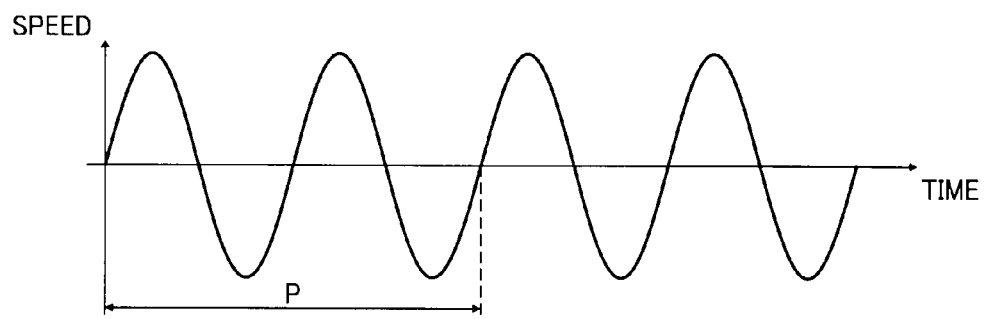
FIG. 10 are timing charts illustrating fluctuations in rotational speed of the code wheel, obtained from pulse signals output by the encoder of FIG. 4, when the code wheel is deformed to be elliptical in shape.
Figure 10B:
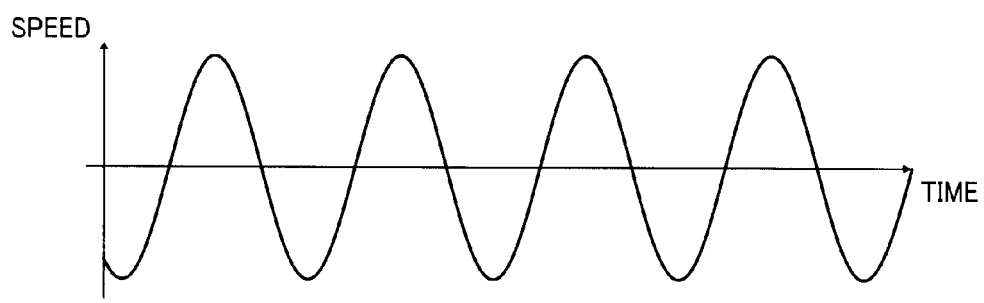
Figure 10C:
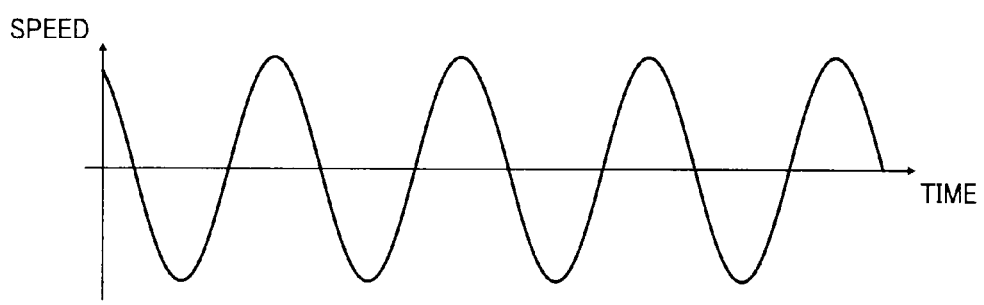

FIG. 10 illustrates the fluctuations in rotational speed of the code wheel 11, obtained from the pulse signals output by the encoder 30 of FIG. 4, which are generated under condition in which the code wheel 11 is deformed to be elliptical in shape. FIG. 10(a) illustrates the fluctuations in rotational speed of the code wheel 11, obtained from the pulse signal output by the pulse generator 32a of the encoder 30. FIG. 10(b) illustrates the fluctuations in rotational speed of the code wheel 11, obtained from the pulse signal output by the pulse generator 32b of the encoder 30. FIG. 10(c) illustrates the fluctuations in rotational speed of the code wheel 11, obtained from the pulse signal output by the pulse generator 32c of the encoder 30.

Referring to FIG. 10(a), when the code wheel 11 is deformed to be elliptical in shape, the pulse interval time of the pulse signal output by the pulse generator 32a that is provided at a relative angle of 0 degree in FIG. 5A is superimposed with the two-cycle error component, which is a two-cycle sine waveform component. Assuming that the rotational shaft 16 has an angular speed of θ, the pulse interval time of the pulse signal output by any one of the pulse generator 32a to 32c while the rotational shaft 16 rotates one cycle in the case in which the code wheel 11 is properly installed is Ts, and the pulse interval time superimposed with the two-cycle error component is T0, the detected pulse interval time Tm0 is obtained using the following equation 5. Further, in this example, the peak value, or the amplitude, is 1.

$$Tm0 = Ts + T0 = Ts + \sin 2\theta \quad \text{[Equation 5]}$$

The pulse signal output by the pulse generator 32b that is provided at the position of a relative angle of 120 degrees in FIG. 5A is superimposed with a two-cycle error component, which is a two-cycle sine waveform component. Assuming that the pulse interval time superimposed with the two-cycle error component is T120, the detected pulse interval time Tm120 is obtained using the following equation 6. In this example, the peak value, or the amplitude, is 1.

$$Tm120 = Ts + T120 = Ts + \sin 2(\theta + 2/3\pi) \quad \text{[Equation 6]}$$

The pulse signal output by the pulse generator 32c that is provided at the position of a relative angle of 240 degrees in FIG. 5A is superimposed with a two-cycle error component, which is a two-cycle sine waveform component. Assuming that the pulse interval time superimposed with the two-cycle error component is T240, the detected pulse interval time Tm240 is obtained using the following equation 7. In this example, the peal value, or the amplitude, is 1.

$$Tm240 = Ts + T240 = Ts + \sin 2(\theta + 4/3\pi) \quad \text{[Equation 7]}$$

The average value of the pulse interval time Tm0, the pulse interval time Tm120, and the pulse interval time Tm240 is obtained using the following equation 8.

[Equation 8]

$$\begin{aligned}(Tm0 + Tm120 + Tm240)/3 &= \{(Ts + T0) + (Ts + T120) + \\ &\quad (Ts + T240)\}/3 \\ &= [(Ts + \sin 2\theta) + \{Ts + \sin 2(\theta + 2/3\pi)\} + \\ &\quad \{Ts + \sin 2(\theta + 4/3\pi)\}]/3 \\ &= (Ts + Ts + Ts)/3 + \{\sin 2\theta + \\ &\quad \sin(2\theta + 4/3\pi) + \sin(2\theta + 8/3\pi)\}/3 \\ &= Ts + \{\sin 2\theta - \sin(2\theta + 1/3\pi) - \\ &\quad \sin(2\theta + -1/3\pi)\}/3 \\ &= Ts + [\sin 2\theta - \{\sin 2\theta * \cos(1/3\pi) + \\ &\quad \cos 2\theta * \sin(1/3\pi)\} - \\ &\quad \{\sin 2\theta * \cos(1/3\pi) - \cos 2\theta * \sin(1/3\pi)\}]/3 \\ &= Ts + (\sin 2\theta - 2 * \sin 2\theta * \cos 1/3\pi)/3 \\ &= Ts\end{aligned}$$

Referring to the above-described equation 8, with the average value of the detected pulse interval times Tm0, Tm120, and Tm240 that are respectively detected by the pulse generators 32a, 32b, and 32c arranged at 120 degree intervals, the two-cycle error component that is superimposed on the pulse interval time of the pulse signal output by the pulse generator 32 due to deformation of the code wheel 11 to be elliptical in shape is eliminated. More specifically, the average value of the detected pulse interval times Tm0, Tm120, and Tm240 correctly reflects the rotational speed of the rotational shaft 16 such that the fluctuations in rotational speed can be detected with improved accuracy.

Figure 11:
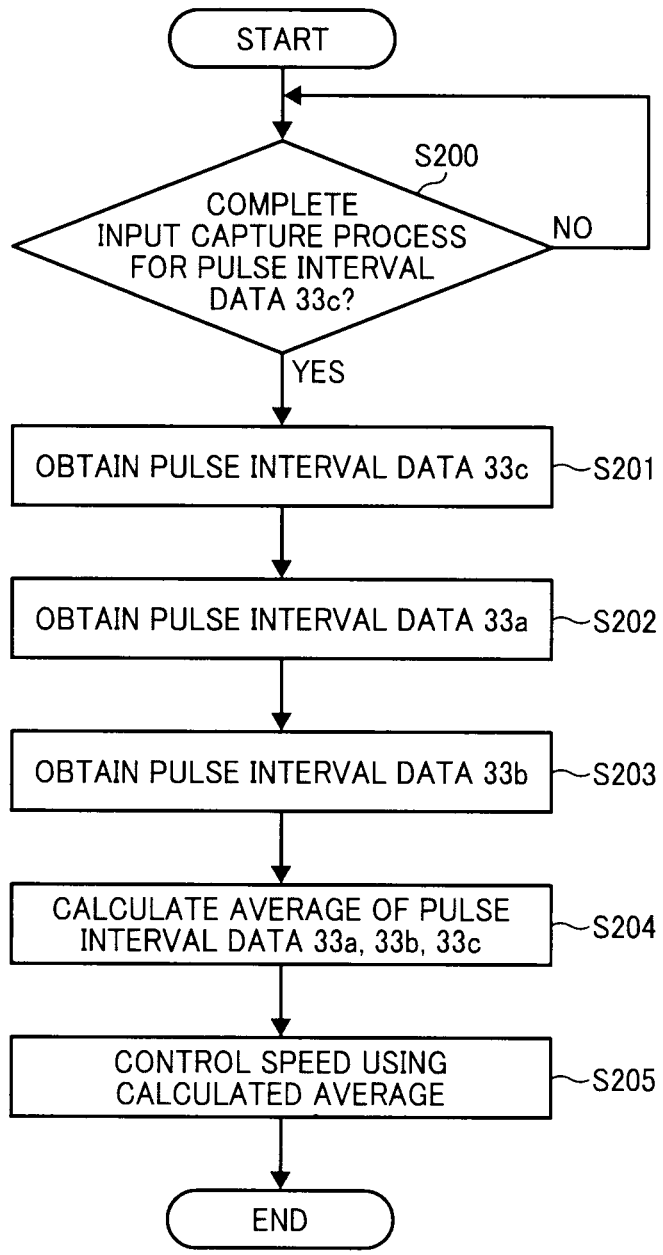
FIG. 11 is a flowchart illustrating operation of removing an error component attributable to eccentricity and deformation of the code wheel from pulse signals output by the encoder of FIG. 4.

Referring to FIG. 11, operation of removing an error component, which is introduced by eccentricity and deformation of the code wheel 11, during rotational speed detection is explained according to an example embodiment of the present invention.

In this example, the input capturer 17a detects the pulse signals respectively output by the pulse generators 32a, 32b, and 32c that are spaced at equal intervals of 120 degrees, and obtains the pulse interval data 33a, 33b, and 33c based on the detected pulse signals of the pulse generators 32a, 32b, and 32c. As illustrated in FIGS. 6(a), 6(b), and 6(c), the pulse signals output by the pulse generator 32a, 32b, and 32c are asynchronous with one another such that the pulse signals are captured independently from one another by the input capturer 17a.

In this example illustrated in FIG. 11, the pulse signal output by the pulse generator 32c of the encoder 30 is treated as a reference signal for the sake of removing a one-cycle error component and a two-cycle error component from the detected pulse signals. Alternatively, any one or all of the pulse signals output by the pulse generators 32a to 32c may be used as a reference signal.

Referring to FIG. 11, at S200, the controller 18 determines whether the input capture process of obtaining the pulse interval data 33c is completed. When it is determined that the input capture process of obtaining the pulse interval data 33c is not completed ("NO" at S200), the operation repeats S200. When it is determined that the input capture process of obtaining the pulse interval data 33c is completed ("YES" at S200), the operation proceeds to S201.

At S201, the controller 18 obtains the pulse interval data 33c from the pulse detector 17. In this example, the obtained pulse interval data 33c is referred to as Tm 240. If the input capture process of obtaining the pulse interval data 33c is completed, the input capture process of obtaining the pulse interval data 33a and the input capture process of the pulse interval data 33b are respectively completed.

At S202, the controller 18 obtains a most updated value of the pulse interval data 33a that is obtained through the input capture process. In this example, the obtained pulse interval data 33a is referred to as Tm0.

At S203, the controller 18 obtains a most updated value of the pulse interval data 33b that is obtained through the input capture process. In this example, the obtained pulse interval data 33b is referred to as Tm120.

At S204, the controller 18 calculates the average value of the pulse interval data 33a Tm0, the pulse interval data 33b Tm120, and the pulse interval data 33c Tm240 using the equation of (Tm0+Tm120+Tm240)/3. As described above, with the average value, the one-cycle error component and the two-error component are removed from the pulse signals such that the rotational speed of the rotational shaft 16 is accurately detected. In this example, the one-cycle error component is an error component that is introduced by eccentricity of the code wheel 11 with respect to the rotational shaft 16. The two-cycle error component is an error component that is introduced by deformation of the code wheel 11.

At S205, the controller 18 controls the rotational speed of the motor 13 using the average value obtained at S204 as a current rotational speed. Since the average value, or the current rotational speed, is free from the one-cycle error component and the two-cycle error component, the rotational speed is controlled with improved accuracy.

Figure 15A:
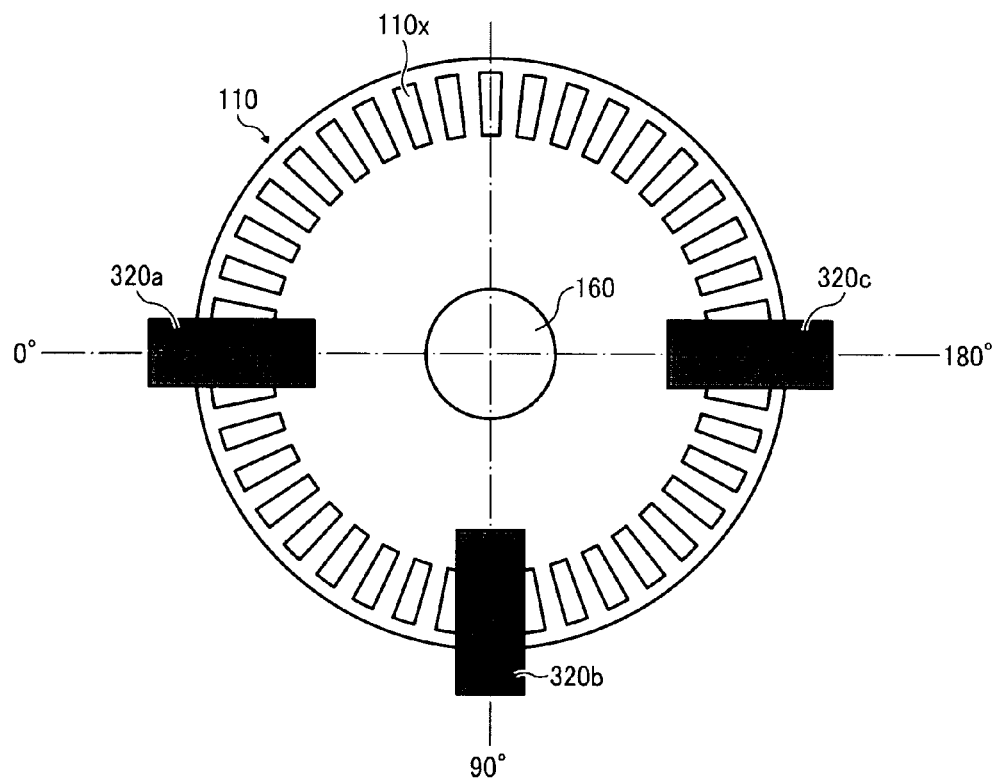
FIG. 15 is an illustration of a background encoder.
Figure 15B:
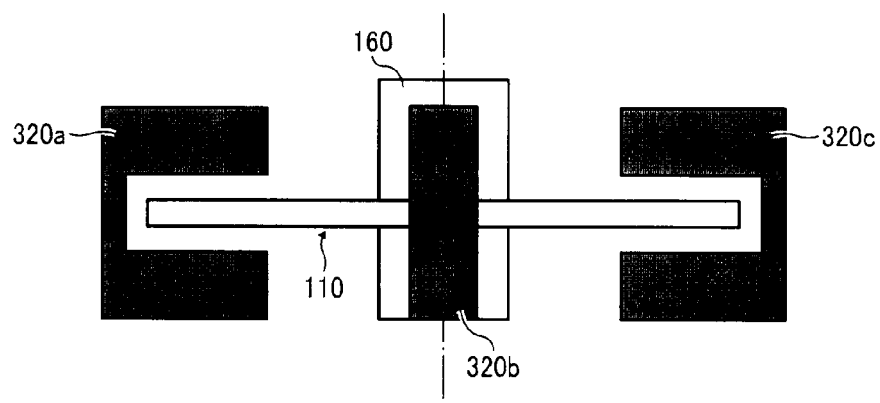

As described above, in the example illustrated in FIG. 4, three pulse generators 32a, 32b, and 32c are arranged at respective positions that are equally spaced at 120 degree intervals, as opposed to the conventional case of three pulse generators 320a, 320b, and 320c of FIG. 15 that are arranged at 90 degree intervals. Further, the average value of the pulse interval times of the pulse signals obtained by the pulse generators 32a, 32b, and 32c that are spaced at 120 degree intervals is calculated. By using the obtained average value, the one-cycle error component and the two-cycle error component that may occur as the rotational shaft 16 rotates one cycle can be eliminated. Accordingly, the rotational speed of the motor 13 is controlled with high accuracy.

More specifically, the one-cycle error components that are superimposed on the pulse signals output by the three pulse generators that are arranged at equal intervals of 120 degrees are respectively expressed as $\sin\theta$, $\sin(\theta+120)$, and $\sin(\theta+240)$. The average value of the one-cycle error components is $1/3*\{\sin\theta+\sin(\theta+120)+\sin(\theta+240)\}=0$. This calculation result indicates that, by averaging, the error components are cancelled out.

The two-cycle error components that are superimposed on the pulse signals output by the three pulse generators that are arranged at equal intervals of 120 degrees are respectively expressed as $\sin 2\theta$, $\sin(2\theta+120)$, and $\sin(2\theta+240)$. The average value of the two-cycle error components is $1/3*\{\sin 2\theta+\sin(2\theta+120)+\sin(2\theta+240)\}=0$. This calculation result indicates that, by averaging, the error components are cancelled out.

Accordingly, by averaging the pulse interval times that are actually detected by the three pulse generators that are arranged at equal intervals of 120 degrees, the error component that may be generated as the rotational shaft of the motor rotates one cycle such as the one-cycle error component and the two-cycle error component can be eliminated. By averaging the pulse interval times respectively obtained from the pulse signals detected by the three pulse generators, the fluctuations in rotational speed of the motor 13 can be detected with high accuracy.

One of the reasons for high quality detection is because the error component is removed based on only information obtained from the pulse signals that are actually detected by the pulse generators in real-time, without relying on other types of information such as previously obtained data as in the case described above referring to FIGS. 15A and 15B.

In addition to improving the accuracy in rotational speed detection, the above-described example of eliminating the error component does not require storing of previously obtained data or a memory space for storing such previously obtained data. Accordingly, elimination of error component can be achieved with a simple structure, while reducing the overall manufacturing cost.

Figure 12:
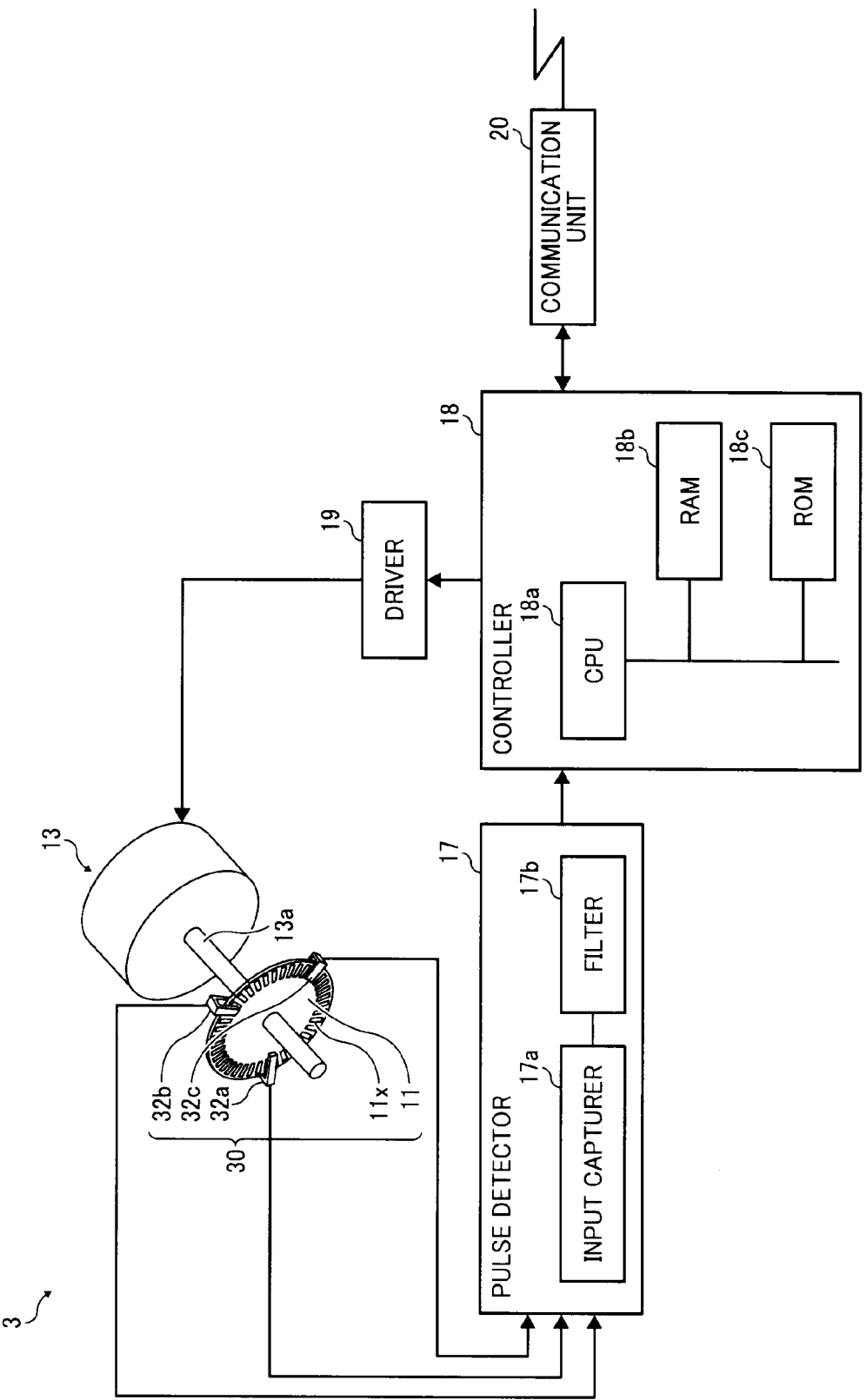
FIG. 12 is a schematic block diagram illustrating a structure of a rotational speed control device having an encoder according to an example embodiment of the present invention.

Referring to FIG. 12, a rotational speed control device 3 is explained according to another example embodiment of the present invention. The rotational speed control device 3 of FIG. 12 is substantially similar in structure to the rotational speed control device 2 of FIG. 4, except for elimination of the gear 14 and the gear 15. Referring back to FIG. 4, in case of the rotational speed control device 2, the gear 14 and the gear 15, which together function as a mechanism for reducing the rotational speed, are provided between the rotational shaft 13a of the motor 13 and the rotational shaft 16 of the code wheel 11. In this example, referring to FIG. 12, the code wheel 11 is fixed onto the rotational shaft 13a of the motor 13.

The above-described operation of eliminating the error component such as the one-cycle error component and the two-cycle error component is applicable to the rotational speed control device 3 that is not provided with the mechanism to reduce the rotational speed.

Figure 13:
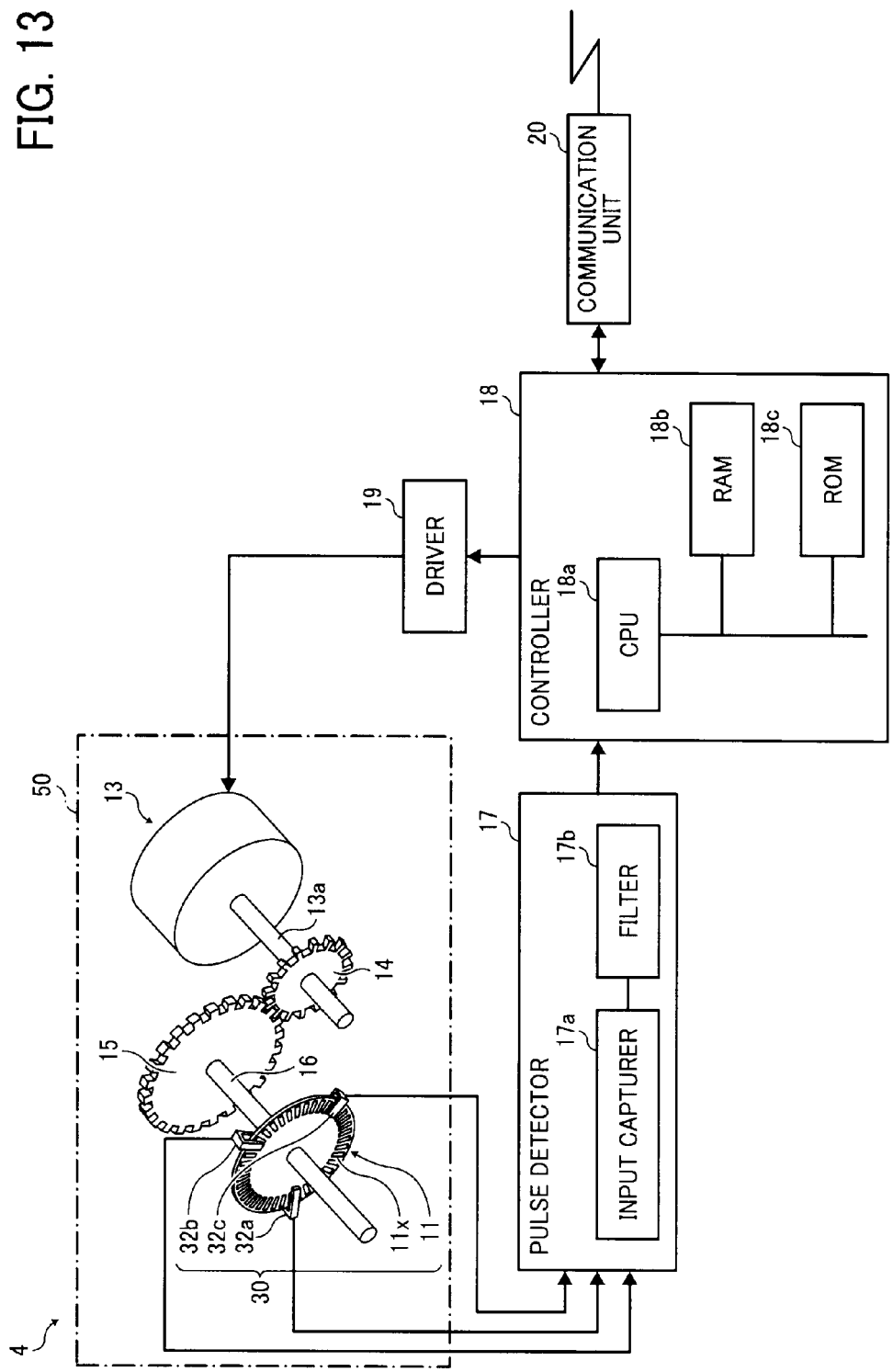
FIG. 13 is a schematic block diagram illustrating a structure of a rotational speed control device having an encoder according to an example embodiment of the present invention.

Referring to FIG. 13, a rotational speed control device 4 is explained according to another example embodiment of the present invention. The rotational speed control device 4 of FIG. 13 is substantially similar in structure to the rotational speed control device 2 of FIG. 4, except for the addition of a rotator module 50. More specifically, the encoder 30, the motor 13, the gear 14, the gear 15, and the rotational shaft 16, which are separately provided in case of the rotational speed control device 2 of FIG. 4, are integrally provided to form the rotator module 50. In order to integrally provide the above-described units as the rotator module 50, the above-described units may be accommodated into one case or one bracket, or mounted on one substrate.

In alternative to integrating the encoder 30, the motor 13, the gear 14, the gear 15, and the rotational shaft 16 into the rotator module 50, only the encoder 30 and the motor 13 may be integrated into a rotator module.

The above-described operation of eliminating the error component such as the one-cycle error component and the two-cycle error component is applicable to the rotational speed control device 4 having a rotator module.

Figure 14:
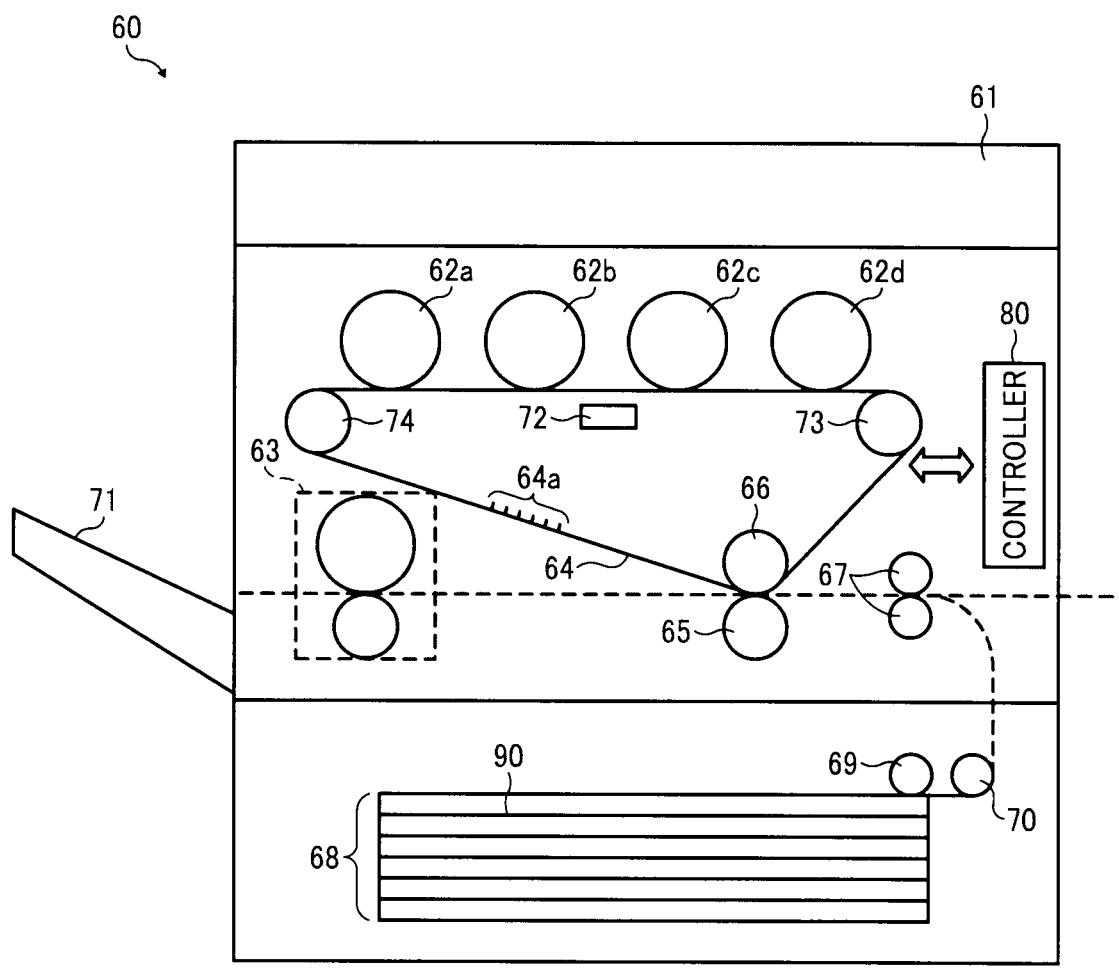
FIG. 14 is a schematic block diagram illustrating a structure of an image forming apparatus.

Referring to FIG. 14, an image forming apparatus 60 having the rotational speed control device 2 of FIG. 4 is explained according to an example embodiment of the present invention.

The image forming apparatus 60 is a color image forming apparatus provided with an intermediate transfer belt of endless type, which functions as an image carrier. The image forming apparatus 60 includes a scanner unit 61, a plurality of photoconductive drums 62a, 62b, 62c, and 62d, an image fixing unit 63, an intermediate transfer belt 64, a secondary transfer roller 65, a transfer roller 66, a registration roller pair 67, a sheet feeding unit 68, a sheet feeding roller 69, a sheet transfer roller 70, a discharge unit 71, an intermediate transfer scale detection sensor 72, a drive roller 73, a driven roller 74, and a controller 80. Numeral 90 refers to a recording sheet.

The scanner unit 61 reads an original into scanned data, and sends the scanned data to the controller 80. The controller 80 generates image data to be formed on the recording sheet 90 based on the scanned data. According to the image data, a plurality of laser lights are irradiated respectively onto the surfaces of the photoconductive drums 62a to 62d to form the images of yellow, cyan, magenta, and black. The images of yellow, cyan, magenta, and black are transferred to the intermediate transfer belt 64, one above the other, to form a color composite image thereon.

The drive roller 73 is rotatably driven by an intermediate transfer belt drive motor. With rotation of the drive roller 73, the intermediate transfer belt 64 rotates. The driven roller 74 rotates as the drive roller 73 rotates. As the intermediate transfer belt 64 moves along the photoconductive drums 62a to 62d, the images formed on the surfaces of the photoconductive drums 62a to 62d are transferred to the intermediate transfer belt 64 so as to form the color composite image. At the secondary transfer roller 65, the color composite image formed on and transferred by the intermediate transfer belt 64 is transferred to the recording sheet 90.

The sheet feeding unit 68 stores therein a stack of recording sheets 90. The sheet feeding roller 69 feeds the recording sheet 90 from the sheet feeding unit 68 to the sheet transfer roller 70. The sheet transfer roller 70 transfers the recording sheet 90 transferred by the sheet feeding roller 69 to the registration roller pair 67. The transfer roller 66 is provided at a position that faces the secondary transfer roller 65 via the intermediate transfer belt 64 to form a nip portion between the intermediate transfer belt 64 and the secondary transfer roller 65. The registration roller pair 67 controls timing at which the recording sheet 90 is transferred while keeping the recording sheet aligned. More specifically, the recording sheet 90 is transferred at a predetermined timing such that the recording sheet 90 receives the toner image at the nip portion formed between the intermediate transfer belt 64 and the secondary transfer roller 65. The image fixing unit 63 fixes the toner image onto the recording sheet 90. The recording sheet 90 having the fixed image thereon is discharged onto the discharge unit 71.

On the intermediate transfer belt 64, an intermediate transfer belt scale 64a is formed. The intermediate transfer belt scale 64a is a scale having reflective sections and non-reflective sections that are alternately provided at a predetermined distance from each other along the belt transfer direction. The intermediate transfer scale detection sensor 72 is provided at a position near the intermediate transfer belt 64 such that the intermediate transfer belt scale 64 can be read. The intermediate transfer scale detection sensor 72 outputs a pulse signal according to a predetermined cycle of the intermediate transfer belt scale 64a formed on the intermediate transfer belt 64.

The controller 80 controls entire operation of the image forming apparatus 60. The controller 80 includes the pulse detector 17, the controller 18, the driver 19, and the communication unit 20, illustrated in FIG. 4. The controller 80 may be implemented by a central processing unit (CPU), a read only memory (ROM), and a main memory. The ROM stores therein a control program. When the control program is loaded from the ROM onto the main memory, the CPU executes a set of instructions according to the control program that is loaded to perform various functions of the controller 80. Alternatively, such functions that may be executed according to the control program may be partly operated by hardware of the image forming apparatus 60. The controller 80 may be implemented by any desired number of units, components, or devices.

The photoconductive drums 62a to 62d are respectively provided with drum motors for driving the photoconductive drums 62a to 62d. Each of the drum motor is provided with the encoder 30. The pulse detector 17, the controller 18, the driver 19, the communication unit 20, and the encoder 30 together form the rotational speed control device 2 of FIG. 4. The rotational speed of the drum motor may be controlled by the controller 80, for example, according to the flowchart illustrated in FIG. 11. Accordingly, even if a one-cycle error component or a two-cycle error component is generated as a rotational shaft of the drum motor rotates one cycle, such error components can be eliminated. Since the fluctuations in rotational speed of the drum motor are accurately detected, such fluctuations may be suppressed with improved accuracy.

In addition to or in alternative to controlling the rotational speed of the drum motor using the operation described above referring to FIG. 11, the rotational speed of any other rotator may be controlled in a substantially similar manner. For example, the encoder 30 may be provided at the intermediate transfer motor that drives the intermediate transfer belt 64 or a secondary transfer motor that drives the secondary transfer roller 65 to control the rotational speed of the intermediate transfer motor or the secondary transfer motor using the controller 80.

As described above, with the rotational speed control device 2 of FIG. 4, the image forming apparatus 60 is able to suppress the fluctuations in rotational speed of a rotator of the image forming apparatus 60, thus improving quality of the output image.

Further, the image forming apparatus 60 may be provided with any one of the rotational speed control devices 2, 3, and 4, or any other rotational speed control device that is capable of eliminating error components using the operation described above referring to FIG. 11, with the encoder 30 having three encoders that are provided at 120 degree intervals.

Numerous additional modifications and variations are possible in light of the above teachings. It is therefore to be understood that within the scope of the appended claims, the disclosure of the present invention may be practiced otherwise than as specifically described herein.

With some embodiments of the present invention having thus been described, it will be obvious that the same may be varied in many ways. Such variations are not to be regarded as a departure from the spirit and scope of the present invention, and all such modifications are intended to be included within the scope of the present invention.

For example, elements and/or features of different illustrative embodiments may be combined with each other and/or substituted for each other within the scope of this disclosure and appended claims.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, involatile memory cards, ROM (read-only-memory), etc.

Alternatively, any one of the above-described and other methods of the present invention may be implemented by ASIC, prepared by interconnecting an appropriate network of conventional component circuits or by a combination thereof with one or more conventional general purpose microprocessors and/or signal processors programmed accordingly.

In one example, the present invention may reside in a pulse generating device including: a rotatable disc having a plurality of patterns that are formed in a circumferential direction of the rotatable disc, the rotatable disc to rotate in synchronization with a rotator; and three pulse generators to each detect the plurality of patterns formed on the rotatable disc and to respectively generate three pulse signals each corresponding to a rotational speed of the rotatable disc based on the detected patterns, wherein the three pulse generators are evenly spaced at intervals of 120 degrees of angle in a circumferential direction of the rotatable disc.

What is claimed is:

1. A rotational speed control device for controlling a rotational speed of a rotator, the control device comprising:
   a rotatable disc having a plurality of patterns that are formed on a surface of the rotatable disc in a circumferential direction of the rotatable disc, the rotatable disc configured to rotate in synchronization with the rotator;
   three pulse generators evenly spaced at intervals of 120 degrees around the circumference of the rotatable disc, configured to each detect the plurality of patterns formed on the rotatable disc and to respectively generate three pulse signals each corresponding to a rotational speed of the rotatable disc based on the detected patterns; and
   a controller configured to control the rotational speed of the rotator based on a signal from which an error component superimposed on the three pulse signals respectively generated by the three pulse generators is removed.

2. The rotational speed control device of claim 1, wherein the controller obtains an average value of the three pulse signals respectively generated by the three pulse generators so as to eliminate the error component.

3. The rotational speed control device of claim 1, further comprising:
   a pulse detector configured to obtain pulse interval time data of the three pulse signals,
   wherein the controller obtains an average value of the three pulse signals by calculating an average value of the pulse interval time data obtained by the pulse detector.

4. The rotational speed control device of claim 1, wherein the error component includes at least one of:
   a one-cycle error component that is superimposed over one cycle of the pulse signals as the rotatable disc rotates one cycle; and
   a two-cycle error component that is superimposed over two cycles of the pulse signals as the rotatable disc rotates one cycle.

5. The rotational speed control device of claim 1, wherein the rotator, the rotatable disc, and the three pulse generators form a single integrated rotator module.

6. An image forming apparatus comprising:
   the rotational speed control device of claim 1.

* * * * *